(12) United States Patent
Wakasugi et al.

(10) Patent No.: US 6,438,013 B2
(45) Date of Patent: Aug. 20, 2002

(54) SEMICONDUCTOR INTEGRATED CIRCUIT AND METHOD FOR ADJUSTING CHARACTERISTICS OF THE SAME

(75) Inventors: Nobuyoshi Wakasugi; Yoshiharu Kato, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/773,002

(22) Filed: Jan. 31, 2001

(30) Foreign Application Priority Data

Feb. 1, 2000 (JP) ........................................ 2000-023912

(51) Int. Cl.$^7$ ................................................ G11C 5/06
(52) U.S. Cl. ................ 365/63; 365/189.07; 365/230.06
(58) Field of Search ....................... 365/189.07, 230.06, 365/230.08, 63, 191, 201, 103, 225.7, 233

(56) References Cited

U.S. PATENT DOCUMENTS 5,237,567 A * 8/1993 Nay et al. .................. 370/85.1
6,181,174 B1 * 1/2001 Fujieda et al. .............. 327/158

* cited by examiner

*Primary Examiner*—David Nelms
*Assistant Examiner*—Gene N. Auduong
(74) *Attorney, Agent, or Firm*—Arent Fox Kintner Plotkin & Kahn, PLLC (57) ABSTRACT

The adjustment control circuit activates the first adjustment signal that adjusts the characteristic of an internal circuit in response to an adjustment signal from the exterior. The ROM circuit activates the second adjustment signal that adjusts the characteristic of the internal circuit when information to adjust the characteristics of the internal circuits is programmed. The selecting circuit outputs either of the first or the second adjustment signal in response to a control signal. The characteristics of the internal circuits are adjusted in response to either the first or the second adjustment signal. Therefore, the second adjustment signal is masked by the selecting circuit selecting the first adjustment signal. That is, at this time, the information programmed in advance in the ROM circuit is invalidated. Further, where no information is programmed in the ROM circuit, the characteristics of the internal circuits can be adjusted without programming the ROM circuit.

10 Claims, 6 Drawing Sheets

SEMICONDUCTOR INTEGRATED CIRCUIT AND METHOD FOR ADJUSTING CHARACTERISTICS OF THE SAME

BACKGROUND OF THE INVENTION

1. Field of the Invention

The present invention relates to a semiconductor integrated circuit that is able to adjust the characteristics of internal circuits by a ROM circuit formed of a fuse and such.

2. Description of the Related Art

Recently, a semiconductor integrated circuit such as DRAMs has been operating at a high speed at a low voltage. In line therewith, it has become necessary that the voltage of the major nodes of internal circuits in this type of a semiconductor integrated circuit and timing of signals transmitted to these nodes are designed at the unit of, for example, 0.01V and 0.1 ns. However, the characteristics of elements such as transistors, resistors, capacitors, that constitute the semiconductor integrated circuit varies, depending on manufacturing lots, wafer positions in the manufacturing lots, or chip positions on the wafer. Therefore, it becomes difficult to design chips as in the minute design as described above.

In the prior arts, a technology has been developed, which produces semiconductor integrated circuits having the required characteristics by adjusting, through trimming, the characteristics that varies depending on such a manufacturing process. Herein, the trimming means changes in the connection of circuits and adjusting the characteristics of the circuits.

Figure 1:
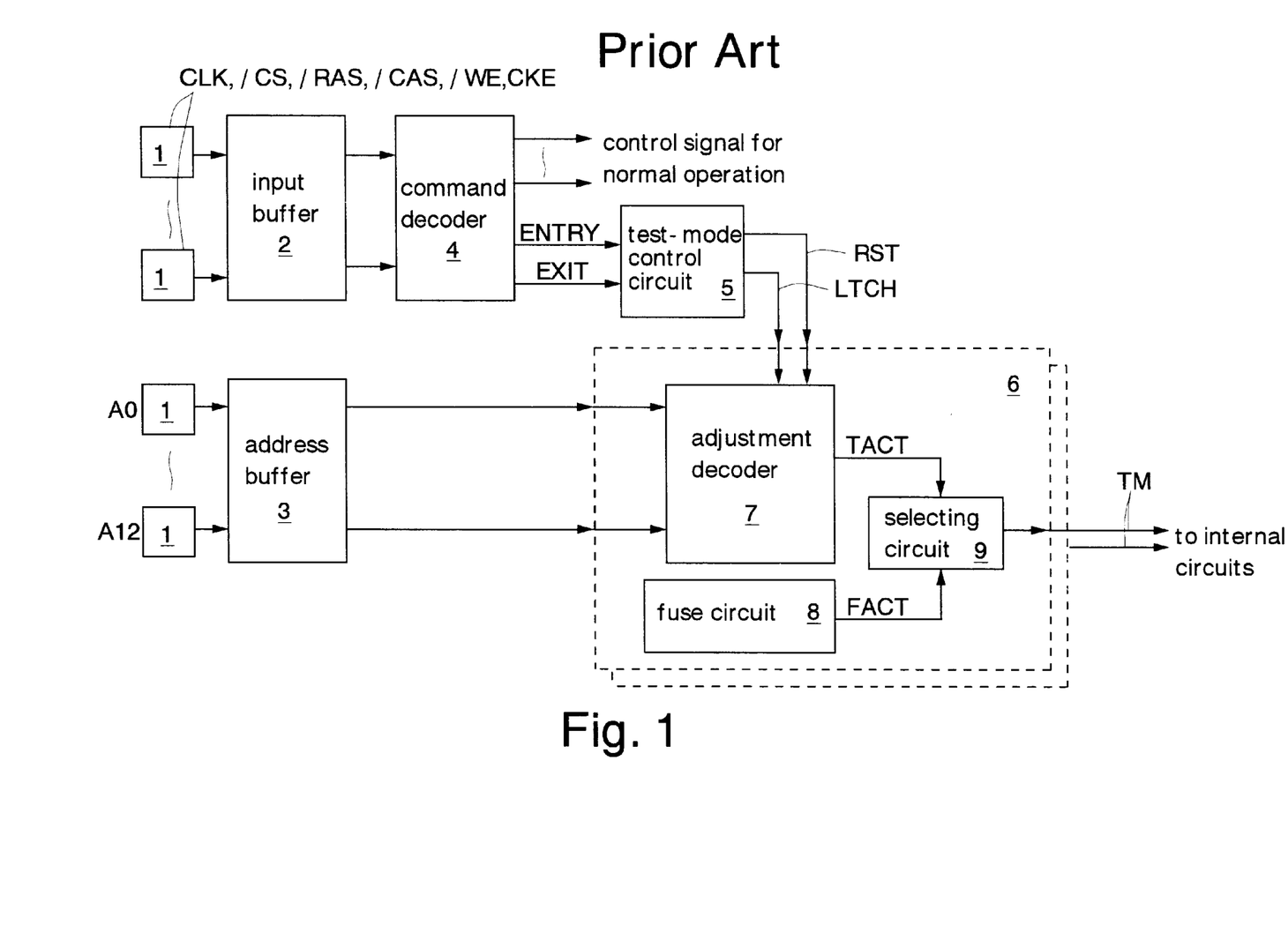
FIG. 1 is a block diagram showing a prior art DRAM.

FIG. 1 shows a DRAM having this type of a trimming feature.

The DRAM has a plurality of pads 1 that receive signals from the exterior, an input buffer 2, an address buffer 3, a command decoder 4, a test mode control circuit 5, and a plurality of adjustment circuits 6. The adjustment circuits 6 are, respectively, composed of an adjustment decoder 7, a fuse circuit 8 and a selecting circuit 9.

The input buffer 2 receives a clock signal CLK, a clock ENABLE signal CKE, and a command signal (/CS, /RAS, /CAS, or /WE) through the pads 1, and outputs the received signal to the command decoder 4. The address buffer 3 receives address signals A0 through A12 through the pads 1, and outputs the received signals to the adjustment circuit 6, address decoder (not shown) and such. The command decoder 4 decodes the received commands signals and outputs a control signal used in a normal operation mode, an entry signal ENTRY used in a testing mode and an exit signal EXIT as command signals.

The test mode control circuit 5 receives the entry signal ENTRY and exit signal EXIT, and outputs a latch signal LTCH and a reset RST, which actuate the adjustment circuit 6 in synchronization with these signals.

The adjustment decoders 7 of the respective adjustment circuits 6 receive address signals A0 through A12, a latch signal LTCH and a reset signal RST, and outputs a test activating signal TACT. The test activating signal TACT is activated when receiving predetermined address signals A0 through A12 in synchronization with the latch signal LTCH, and is inactivated when receiving the reset signal RST.

The fuse circuit 8 has a fuse formed of polysilicon and such, and a control circuit. The fuse circuit 8 activates a fuse activating signal FACT when the fuse blows (when programming).

The selecting circuit 9 outputs an OR logic of the test activating signal TACT and the fuse activating signal FACT to the internal circuits to adjust the characteristics as a test mode signal TM. That is, the test mode signal TM is activated when any one of the test activating signal TACT and fuse activating signal FACT is activated. And, in the internal circuits, the connections are changed upon the activation of the test mode signal TM, wherein the internal timing and internal voltage are finely adjusted. Also, in order for the timing of a certain control signal to be caused to slip by +0.1 ns or +0.2 ns, the adjustment circuit 6 will be required, respectively.

In the test process, a probing test is carried out after a wafer is completed. The electric characteristics of respective chips are evaluated. At this time, for chips not having enough margins in the characteristics compared to the specifications, a trimming test is carried out. In the trimming test, the above-mentioned plurality of adjustment circuits 6 are actuated one after another, how and which internal circuits are adjusted are confirmed with respect to that the chips will have characteristics such that they can be shipped. After that, in the fuse process, a fuse formed in an adjustment circuit 6 for which activation is required is blown. The adjustment circuit 6 in which the fuse is blown normally activates the test mode signal TM. And, a chip is assembled in the assembling process, and the final test is carried out, wherein good chips are shipped.

Thus, by improving the characteristics of the internal circuits by the trimming, the yield can be remarkably increased.

However, in prior art adjustment circuits 6, after the test mode signal TM was activated by the blowing of the fuse, the test mode signal TM could not be activated again. This is because there was no idea that the blown fuse is restored to its original state in order to relieve malfunction in the characteristics.

But, there are cases where the characteristics of shipped products are desired to be re-evaluated at the point of time when wafer is completed, in line with a decrease in the margin for action by high integration and high speed processing of semiconductor integrated circuits.

In such cases, in the prior arts, there was only a case where a mechanical means such as an FIB (Focused Ion Beam) processing apparatus is used. In the FIB processing apparatus, for example, a blown fuse can be re-connected, wherein the connections of wiring of control signals can be changed. However, in order to carry out FIB-process, a package that molds a chip can be drilled, and the chip surface must be exposed. Thus, the FIB process requires a particular technique including the pre-treatment. There was a problem by which a longer period of time is required.

SUMMARY OF THE INVENTION

It is an object of the invention to provide a semiconductor integrated circuit that resets the characteristics of internal circuits after the characteristics thereof are adjusted by a ROM circuit formed of a fuse and such.

It is another object of the invention to provide a method for further adjusting the characteristics of internal circuits after the characteristics thereof are adjusted by a ROM circuit formed of a fuse and such, and in particular to provide a method for adjusting the characteristics of the internal circuits without destroying the semiconductor integrated circuit.

According to one of the aspects of the semiconductor integrated circuit of the invention, the semiconductor integrated circuit comprises an adjustment control circuit, a ROM circuit, and a selecting circuit. The adjustment control circuit activates the first adjustment signal that adjusts the characteristic of an internal circuit in response to an adjustment signal from the exterior. The ROM circuit activates the second adjustment signal that adjusts the characteristic of the internal circuit when information to adjust the characteristics of the internal circuits is programmed. The selecting circuit outputs any one of the first adjustment signal and the second adjustment signal in response to a control signal. The characteristics of the internal circuits are adjusted in response to any one of the first adjustment signal and the second adjustment signal. Therefore, by means of the selecting circuit selecting the first adjustment signal, the second adjustment signal is masked. That is, at this time, the information programmed in the ROM circuit in advance is invalidated. Further, where no information is programmed in the ROM circuit, it is possible to adjust the characteristics of the internal circuits without programming the ROM circuit.

According to another aspect of the semiconductor integrated circuit of the invention, the semiconductor integrated circuit has a normal operation mode and a test mode. The adjustment control circuit is activated during the test mode, and activates the first adjustment signal in response to an adjustment signal. Therefore, it is possible to prevent the characteristic of the internal circuit from changing due to an erroneous operation of the adjustment control circuit in the normal operation mode. Resultantly, malfunction of the semiconductor integrated circuit can be prevented from occurring.

According to still another aspect of the semiconductor integrated circuit of the invention, the semiconductor integrated circuit comprises a command decoder that receives a command signal from the exterior and outputs a command control signal by which the operation of the internal circuits is controlled. The adjustment control circuit is controlled by a command control signal corresponding to the test mode to adjust the internal circuits. For this reason, by changing the logic of the command decoder that has already been designed, the adjustment control circuit can be easily controlled, whereby the characteristics of the internal circuits can be adjusted.

According to yet another aspect of the semiconductor integrated circuit of the invention, the adjustment control circuit receives a plurality of adjustment signals and activates the first adjustment signal when these signals are of a predetermined logic. Accordingly, it is possible to easily design a plurality of adjustment control circuits by only changing the logic of input signals. Resultantly, the verifying of the design is also made easy. A number of the first adjustment signals can be generated with a small number of signals.

According to yet another aspect of the semiconductor integrated circuit of the invention, the semiconductor integrated circuit comprises a plurality of memory cells. The adjustment control circuit activates the first adjustment signal using an address signal for selecting these memory cells. That is, the address signal is made into an adjustment signal in the test mode. Therefore, the address signal that is scarcely used in the test mode can be effectively utilized.

According to yet another aspect of the semiconductor integrated circuit of the invention, the semiconductor integrated circuit comprises a characteristic control circuit corresponding to one characteristic of the internal circuit and a plurality of adjustment circuits respectively corresponding to the adjusting values of the characteristics of the internal circuit which the characteristic control circuit controls. The respective adjustment circuits have an adjustment control circuit, a ROM circuit, and a selecting circuit. First, the characteristic control circuit is activated in response to a selecting signal from the exterior and generates a control signal. By the control signal, the second adjustment signal corresponding to one characteristic of the internal circuits is masked, and information programmed in the ROM circuit in advance is invalidated. Next, if the first adjustment signal is activated, the characteristics of the internal circuits are newly adjusted. If none of the first adjustment signals is activated, the masking of the second adjustment signal is retained, and the characteristics of the internal circuits become the same as that when production has been completed. Thus, by means of the circuit for selecting the characteristic of the internal circuits and a circuit for selecting the adjustment value of the characteristic being constructed in a hierarchical structure, circuit designing and layout designing can be facilitated. Since the number of characteristic control circuits decreases, the chip size can be reduced.

According to yet another aspect of the semiconductor integrated circuit of the invention, the semiconductor integrated circuit comprises a command decoder that receives a command signal from the exterior and outputs a command control signal to control the operation of the internal circuit. The characteristic control circuit is controlled by a command control signal corresponding to the test mode to adjust the internal circuit. Therefore, by changing the logic of the command decoder that is already designed, the characteristic control circuit can be easily controlled, and the characteristics of the internal circuit can be adjusted.

According to yet another aspect of the semiconductor integrated circuit of the invention, the semiconductor integrated circuit comprises a plurality of characteristic control circuits and a plurality of adjustment circuits. The respective characteristic control circuits receive a plurality of selecting signals and activate a control signal when these selecting signals are of a predetermined logic. Therefore, by only changing the logic of the input signals, it is possible to easily design a plurality of characteristic control circuits. As a result, the design can be easily verified, and a number of types of characteristic control circuits can be formed by a small number of signals.

According to one of the aspects of a method for adjusting the characteristics of the semiconductor integrated circuit of the invention, the second adjustment signal which is outputted by the ROM circuit having information to change the characteristics of the internal circuits programmed therein is masked in response to a control signal. Also, the characteristic of the internal circuit is adjusted by the first adjustment signal generated in response to an adjustment signal from the exterior. Therefore, the information programmed in the ROM circuit in advance can be invalidated. Further, if no information is programmed in the ROM circuit, it is possible to easily adjust the characteristics of the internal circuits without programming the ROM circuit.

According to another aspect of the method for adjusting the characteristics of the semiconductor integrated circuit of the invention, a control signal corresponding to one characteristic of an internal circuit to be adjusted is activated in response to a selection signal from the exterior. Also, a plurality of adjustment signals is received from the exterior, and an adjusting value of the characteristics of the internal circuit is obtained in response to the logic of these adjustment signals. The characteristic of the internal circuit is adjusted by the first adjustment signal corresponding to the obtained adjusting value. Thus, by selecting the characteristic of the internal circuit to be adjusted and the adjusting value of the characteristic one after another, the circuit can be constituted in a hierarchical structure, wherein circuit design and layout design can be facilitated.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, a description is given of embodiments of the invention with reference to the accompanying drawings.

Figure 2:
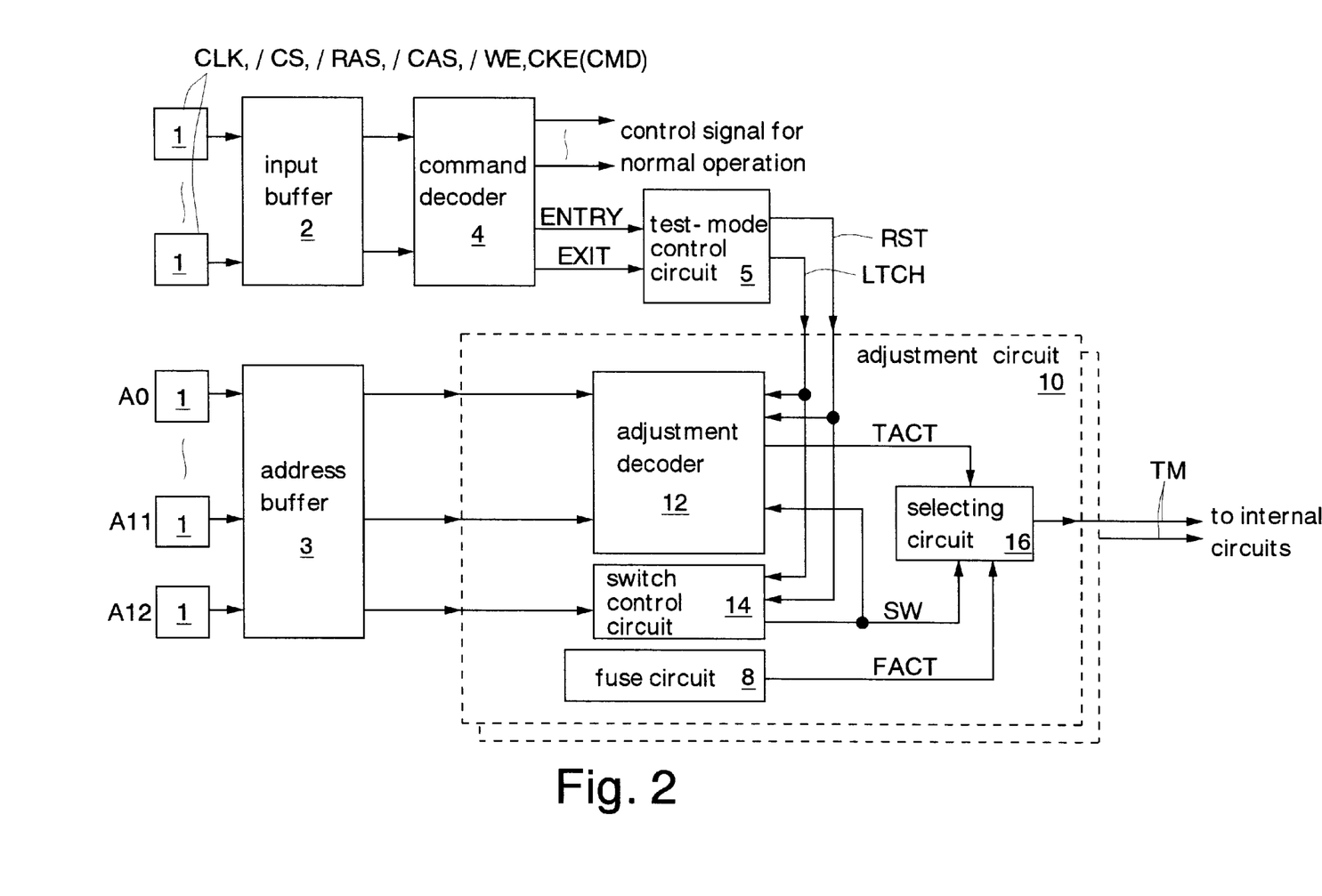
FIG. 2 is a block diagram showing a first embodiment of the present invention.

FIG. 2 shows the first embodiment of a semiconductor integrated circuit and a method for adjusting the characteristics of the semiconductor integrated circuit according to the present invention. Circuits that are identical to those in prior arts are given the same reference numbers, and detailed description thereof is omitted.

The semiconductor integrated circuit is formed, as a DRAM, on a silicon substrate using a CMOS process.

The DRAM has a plurality of pads 1 that receive signals from the exterior, an input buffer 2, an address buffer 3, a command decoder 4, a test mode control circuit 5, and a plurality of adjustment circuits 10. The adjustment circuit 10 is composed of an adjustment decoder 12, a switch control circuit 14, a fuse circuit 8 and a selecting circuit 16. The adjustment decoder 12 and fuse circuit 8, respectively, correspond to an adjustment control circuit and a ROM circuit. Also, the DRAM has a memory core provided with a plurality of memory cells (not shown) and a plurality of control circuits to control the memory core.

The input buffer 2, address buffer 3, command decoder 4 and test mode controlling circuit 5 are the same as those in the prior arts, and the same signal lines that are the same as those of the prior arts are connected thereto.

The adjustment decoder 12 of the adjustment circuit 10 activates the test activating signal TACT when it receives an predetermined address signal (adjustment signal) in synchronization with a latch signal LTCH during the activation of a switching signal SW, and inactivates the test activating signal TACT when it receives a reset signal RST.

The switch control circuit 14 activates a switching signal SW when it receives a high level address signal A12 from the exterior in synchronization with a latch signal LTCH, and inactivates a switching signal SW when it receives a reset signal RST.

The selecting circuit 16 outputs the logic of the test activating signal TACT as a test mode signal TM when the switching signal SW is activated (is made into a high level), and outputs the logic of the fuse activating signal FACT as a test mode signal TM when the switching signal SW is inactivated (is made into a low level). The selecting circuit 16 is formed of two CMOS transmission gates that are turned on and off, for example, upon receiving a switching signal SW. In an internal circuit that requires trimming, the circuit connection is changed upon receiving activation of the test mode signal TM, and the internal timing or internal voltage is finely adjusted.

Further, as in the prior arts, the adjustment circuit is required, respectively, in order to cause the timing of a certain control signal to slip by +0.1 ns or +0.2 ns. The test activating signal TACT, fuse activating signal FACT, and switching signal SW, respectively, correspond to the first adjustment signal, the second adjustment signal, and control signal.

Figure 3:
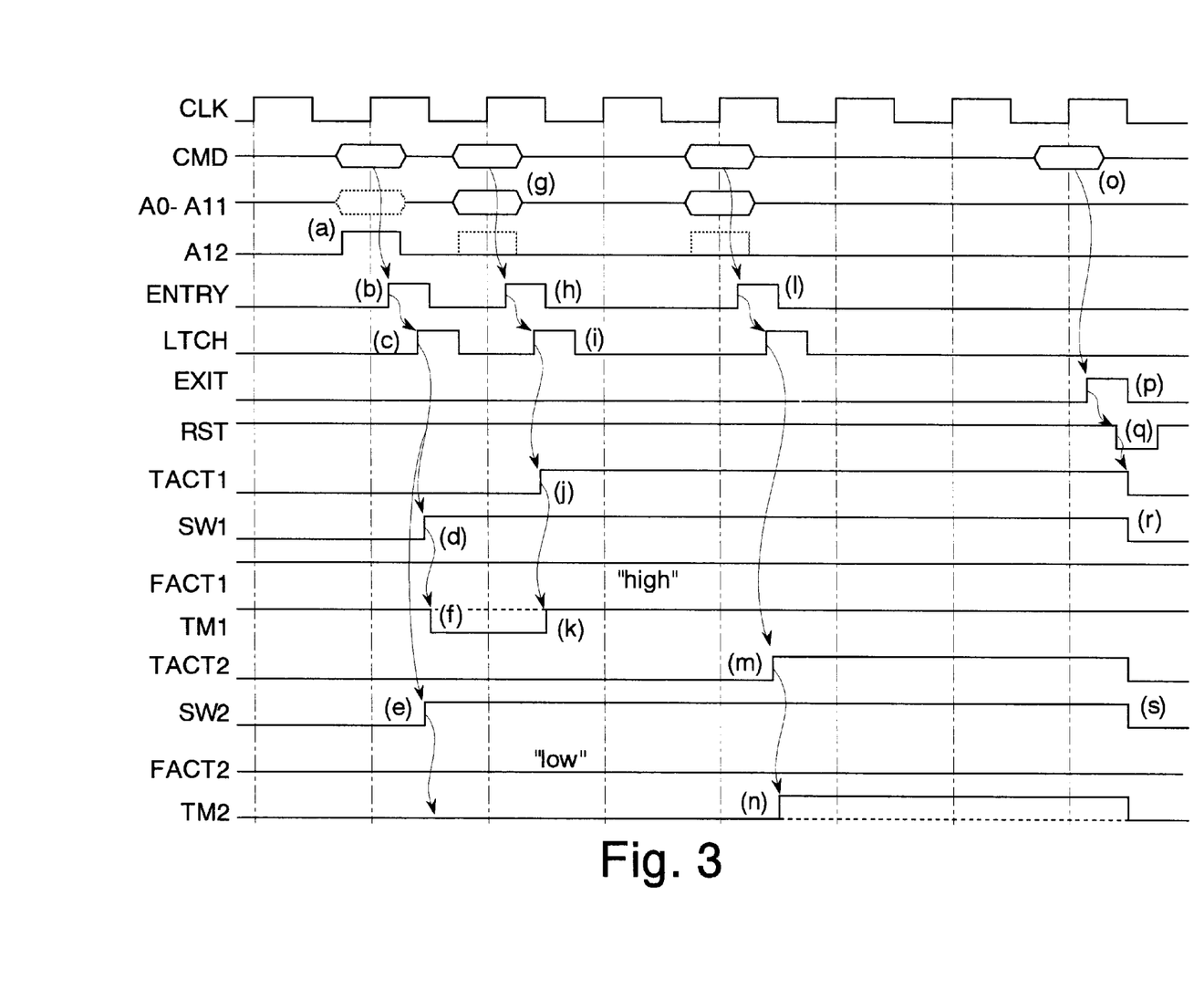
FIG. 3 is a timing diagram showing control of re-trimming in the first embodiment.

FIG. 3 shows a timing to carry out retrimming of the characteristics of the DRAM. Herein, a description is given of an example in which an adjustment circuit whose fuse has blown ("1" is added to the symbol name), and an adjustment circuit 10 whose fuse is not blown ("2" is added to the symbol name) are controlled. Since control is carried out by a LSI tester, it may be applicable to both a chip on a wafer and a packaged chip. That is, it is not necessary to process the chip or the package that covers the chip.

First, a command signal (CMD) for trimming and a high-leveled address signal A12 are supplied in synchronization with the rise of a clock signal CLK (FIG. 3(a)). At this time, the address signals A0 through A11 may not be supplied.

The command decoder 4 shown in FIG. 2 receives a command signal for trimming and activates an entry signal ENTRY (makes it into a high level) (FIG. 3(b)). The test mode controlling circuit 5 receives the entry signal ENTRY and activates a latch signal LTCH (makes it into a high level) (FIG. 3(c)).

The switch control circuit 14 receives a high-leveled latch signal LTCH and activates the switching signals SW1 and SW2, respectively (FIG. 3(d, e)). Since the adjustment decoder 12 receives the low-leveled switching signals SW1 and SW2 at this time, the test activating signals TACT1 and TACT2 are not activated.

The selecting circuit 16 of the adjustment circuit 10 whose fuse has blown receives the high-leveled switching signal SW1 and outputs the low-leveled test activating signal TACT1 as a test mode signal TM1 (FIG. 3(f)). That is, the fuse activating signal FACT1 that is outputted at a high level by the blowing of the fuse is masked.

Next, address signals A0 through A11 corresponding to he adjustment circuit 10 whose fuse has blown are supplied in synchronization with the rise of the next clock signal CLK (FIG. 3(g)). At this time, the address A12 may not be supplied.

The command decoder 4 receives a command signal and activates the entry signal ENTRY again (FIG. 3(h)). The test mode controlling circuit 5 receives an entry signal ENTRY and activates the latch signal LTCH again (FIG. 3(i)).

The adjustment decoder 12 of the adjustment circuit 10 whose fuse has blown receives a high-leveled switching signal SW1 and activates the test activating signal TACT1 (makes it into a high level) (FIG. 3(j)). The selecting circuit 16 outputs the test activating signal TACT1 as a test mode signal (TM1) of a high level (FIG. 3(k)). That is, the internal circuits are made into the state where the fuse has blown, by the adjustment decoder 12 and the selecting circuit 16.

Address signals A0 through A11 corresponding to the command signal (CMD) and the adjustment circuit 10 whose fuse is not blown are supplied in synchronization with the rise of another clock signal CLK. The command decoder 4 activates the entry signal ENTRY again, and the test mode controlling circuit 5 activates the latch signal LTCH again (FIG. 3(*l*)).

The adjustment decoder 12 of the adjustment circuit 10 whose fuse is not blown receives the high-leveled switching signal SW2 and activates the test activating signal TACT 2 (makes it into a high level) (FIG. 3(*m*)). The selecting circuit 16 outputs the test activating signal TACT2 as a test mode signal TM2 (high level) (FIG. 3(*n*)). That is, the internal circuits are made into the same state as those where the fuse blows.

Thus, predetermined circuits are trimmed by a command input and an address input regardless of whether or not the fuse blows, and the electrical characteristics of the DRAM are evaluated by using an LSI tester.

After the characteristics are evaluated, a command signal (CMD) to terminate the trimming test is supplied in synchronization with the rise of a clock signal CLK (FIG. 3(*o*)). At this time, it is not necessary that the address signals A0 through A12 be supplied.

The command decoder 4 receives a command signal and activates the exit signal EXIT (FIG. 3(*p*)). The test mode controlling circuit 5 receives the exit signal EXIT and activates a reset signal RST (FIG. 3(*q*)). Also, the reset signal RST is a negative logic signal that is activated at a low level.

The adjustment decoder 12 and switch control circuit 14 of all the adjustment circuits 10 receive a reset signal RST and inactivate the test activating signals TACT (TACT1 and TACT2) and switching signals SW (SW1 and SW2) (make them into a low level) (FIG. 3(*r, s*)).By the activation of the exit signal EXIT, the DRAM enters a state where the fuse is blown and it can be shipped, wherein the trimming test is terminated.

As described above, in the embodiment, the selecting circuit 16 masks the fuse activating signal FACT in response to the activation of the switching signal SW. Therefore, information programmed in the fuse circuit 8 in advance can be invalidated.

The selecting circuit 16 receives the activation of the switching signals SW and outputs a test activating signal TACT, which is outputted by the adjustment decoder 12, as a test mode signal TM. Therefore, where no information is programmed in the fuse circuit 8, it is possible to easily adjust the characteristics of the internal circuits without programming the fuse circuit 8.

The adjustment circuit 10 is activated by the test mode controlling circuit 5 when in the test mode (that is, the trimming test). Accordingly, it is possible to prevent the DRAM from malfunctioning due to erroneous operations of the adjustment circuit 10 and changes in the characteristics of the internal circuits.

The trimming test was entered by the command decoder 4 and the characteristics of the internal circuits were adjusted. Therefore, by changing the logic of the command decoder that is already designed, it is possible to easily control the adjustment circuit 10 and to adjust the characteristics of the internal circuits.

The adjustment decoder 12 outputted test activating signals TACT (TACT1 and TACT2) by decoding the address signals A0 through A11. Accordingly, it is possible to design adjustment decoders 12 (adjustment circuits 10) whose number corresponds to combinations of the address signals A0 through A11. As a result, the design can be easily verified. By using address signals A0 through A11 of 12 bits, 4096 adjustment circuits 10 can be distinguished.

Figure 4:
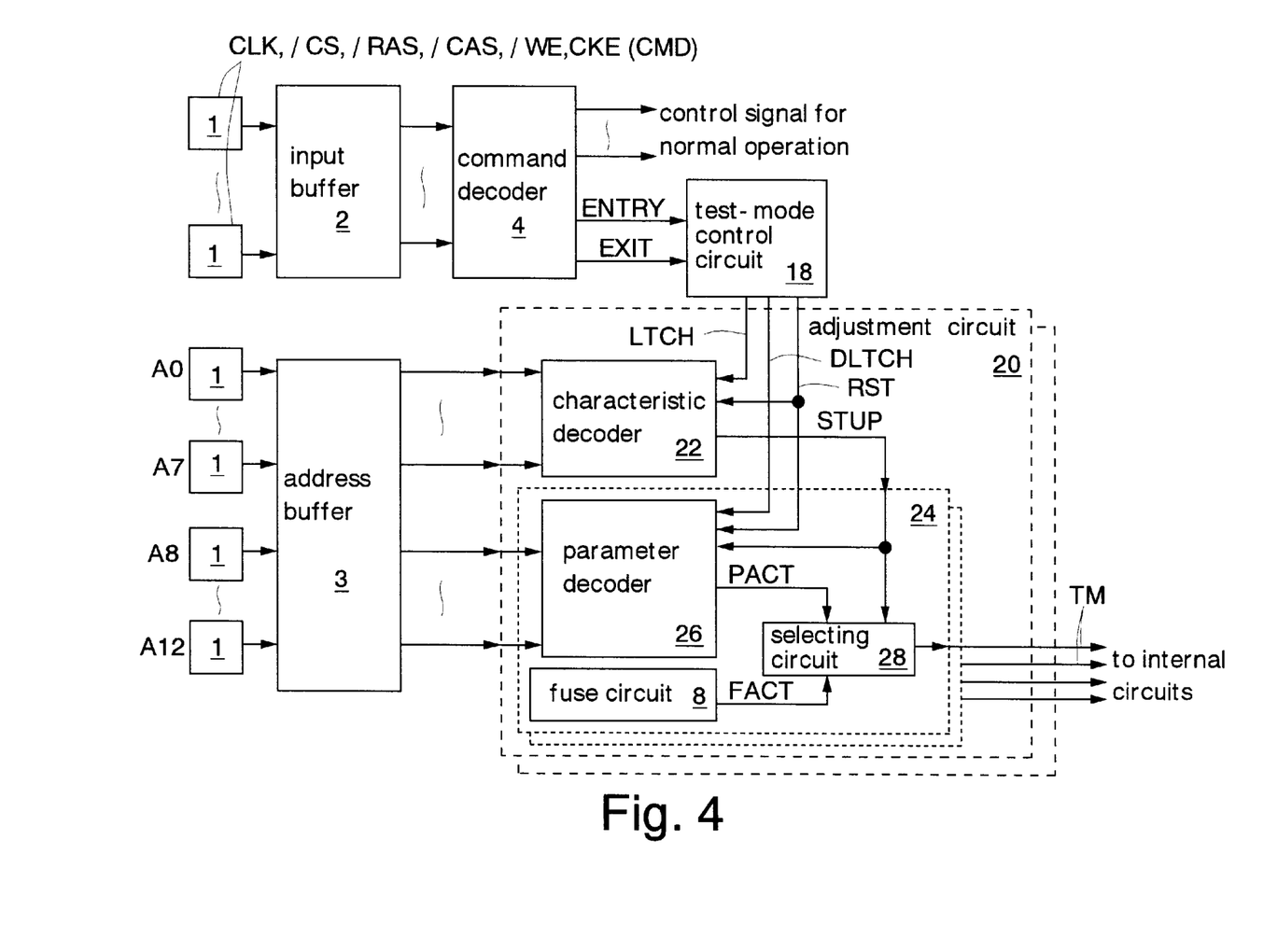
FIG. 4 is a block diagram showing a second embodiment of the present invention.

FIG. 4 shows a second embodiment of the semiconductor integrated circuit according to the invention and a method for adjusting the characteristics of the semiconductor integrated circuit. Circuits that are identical to those in the prior arts and the first embodiment are given the same reference numbers, and detailed description thereof is omitted.

In the second embodiment, a test mode controlling circuit 18 and an adjustment circuit 20 differ from those in the first embodiment. The other constructions are identical to those of the first embodiment.

The test mode controlling circuit 18 receives am entry signal ENTRY and an exit signal EXIT from the command decoder 4 and outputs a latch signal LTCH, a delayed latch signal DLTCH and a reset signal RST that actuate the adjustment circuit 20 in synchronization with these signals.

The adjustment circuit 20 has a characteristic decoder 22 and a plurality of parameter control circuits 24. The parameter control circuits 24 have a parameter decoder 26, a fuse circuit 8 and a selecting circuit 28.

The characteristic decoder 22 receives lower address signals A0 through A7, a latch signal LTCH and a reset signal RST, and outputs a setup signal STUP. The address signals A0 through A7 are used as selecting signals to select one of the characteristics of the internal circuits. A parameter decoder 26 is activated by the setup signal STUP, and activates a parameter activating signal PACT when it receives predetermined address signals A8 through A12 in synchronization with the delayed latch signal DLTCH, and inactivates the parameter activating signal PACT when it receives the reset signal RST.

The characteristic decoder 22, parameter decoder 26, setup signal STUP and parameter activating signal PACT, respectively correspond to the characteristic control circuit, adjustment control circuit, control signal and the first adjustment signal.

The selecting circuit 28 outputs the logic of the parameter activating signal PACT as a test mode signal TM when the setup signal STUP is activated (is made into a high level) and outputs the logic of the fuse activating signal FACT as a test mode signal TM when the setup signal STUP is inactivated (is made into a low level). The selecting circuit 28 is formed of, for example, two CMOS transmission gates that receive a switching signal SW and are, respectively, turned on and off. In the internal circuit for which adjustment is required, the circuit connection is changed upon receiving the activation of the test mode signal TM, and the internal timing and internal voltage are finely adjusted.

Also, a plurality of adjustment circuits 20 are formed per characteristic of the internal circuit to be trimmed and have parameter controlling circuits 24 whose number is equivalent to the number of the adjusting values of the characteristic. That is, the adjustment circuits 20 have a parameter decoder 22 that distinguishes the trimming characteristic and a parameter decoder 26 that distinguishes the characteristic value, which are formed in a hierarchical structure. Therefore, in comparison with the first embodiment, circuit design, layout design of the adjustment circuits 20, and verification thereof are facilitated. The number of the adjustment circuits 20 can be remarkably reduced in comparison with the number of the adjustment circuits 10 in the first embodiment. As a result, the chip size can be reduced.

Figure 5:
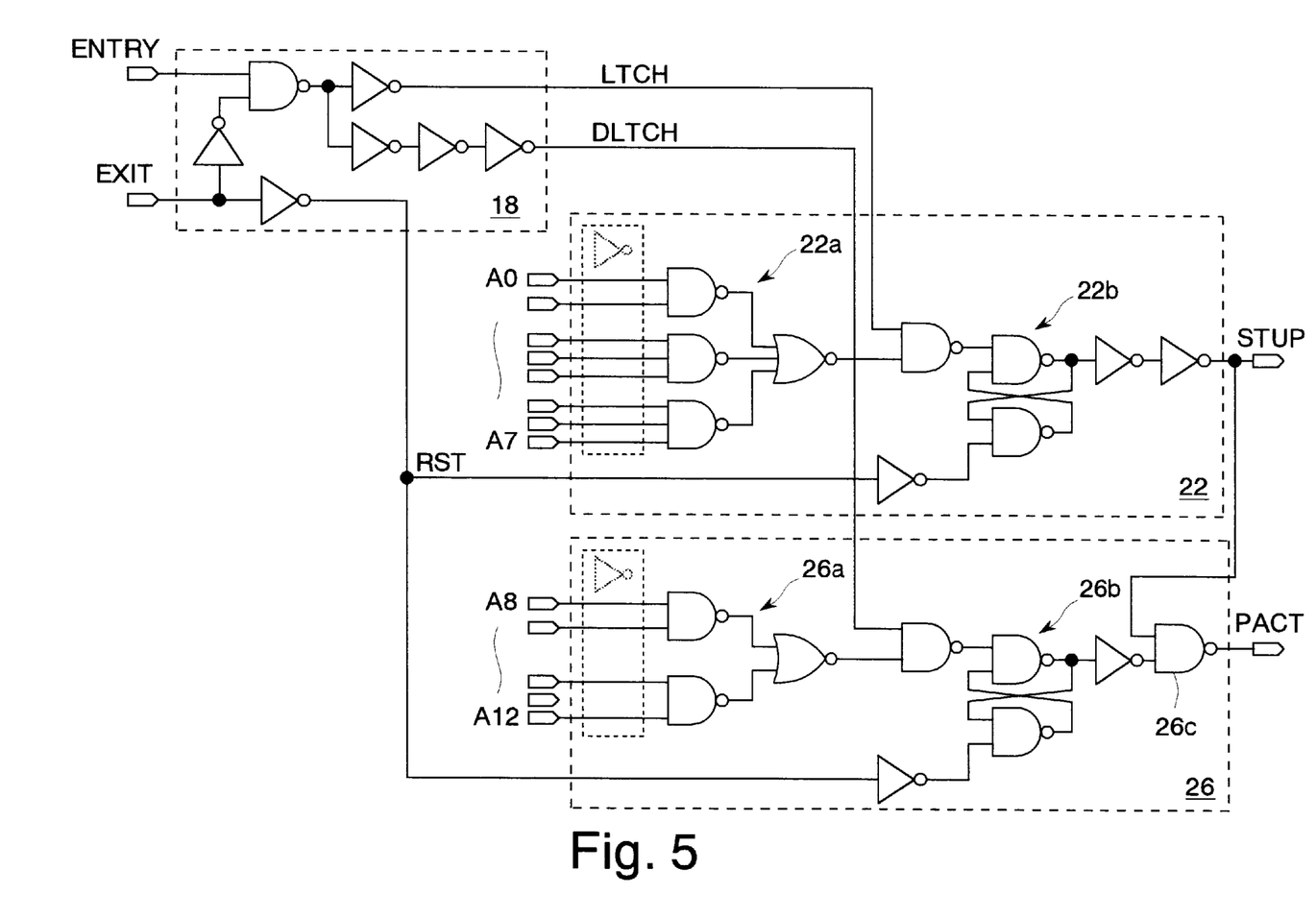
FIG. 5 is a circuit diagram showing the detail of the major parts of FIG. 4.

FIG. 5 shows the detail of a test mode controlling circuit 18, a characteristic decoder 22 and a parameter decoder 26.

The test mode controlling circuit 18 is composed of a logic gate that, when the exit signal EXIT is inactivated, outputs an entry signal ENTRY as a latch signal LTCH and a delayed latch signal DLTCH and a logic gate that outputs the exit signal EXIT as a reset signal RST. The delayed latch signal DLTCH is a signal that is delayed by two steps of an inverter in comparison with the latch signal LTCH.

The characteristic decoder 22 has a decoding circuit 22a that decodes predetermined address signals A0 through A7 and an RS flip-flop 22b. An inverter is added to an input of the decoding circuit 22a according to the characteristics to be trimmed. The RS flip-flop 22b is set (is made into a high level) upon receiving the activation (high level) of the decoding circuit 22a and is reset (is made into a low level) upon receiving the activation of the reset signal RST. The RS flip-flop 22b holds a reset state when the decoding circuit 22a is not activated during the activation of the latch signal LTCH. The setup signal STUP is made into a high level when the RS flip-flop 22b is set and is made into a low level when the RS flip-flop 22b is reset.

The parameter decoder 26 has a decoding circuit 26a that decodes predetermined address signals A9 through A12, an RS flip-flop 26b and a NAND gate 26c that controls an output of the RS flip-flop 26b. An inverter is added to an input of the decoding circuit 26a according to the adjusting values of the characteristics to be trimmed. The RS flip-flop 26b is set (is made into a high level) upon receiving the activation (high level) of the decoding circuit 26a during the activation of the delayed latch signal DLTCH and is reset (is made into a low level) upon receiving the activation of the reset signal RST. The RS flip-flop 26b holds a reset state when the decoding circuit 26a is not activated during the activation of the delayed latch signal DLTCH. The NAND gate 26c outputs an output of the RS flip flop 26b as a parameter activating signal PACT when the setup signal STUP is activated (is made into a high level).

Figure 6:
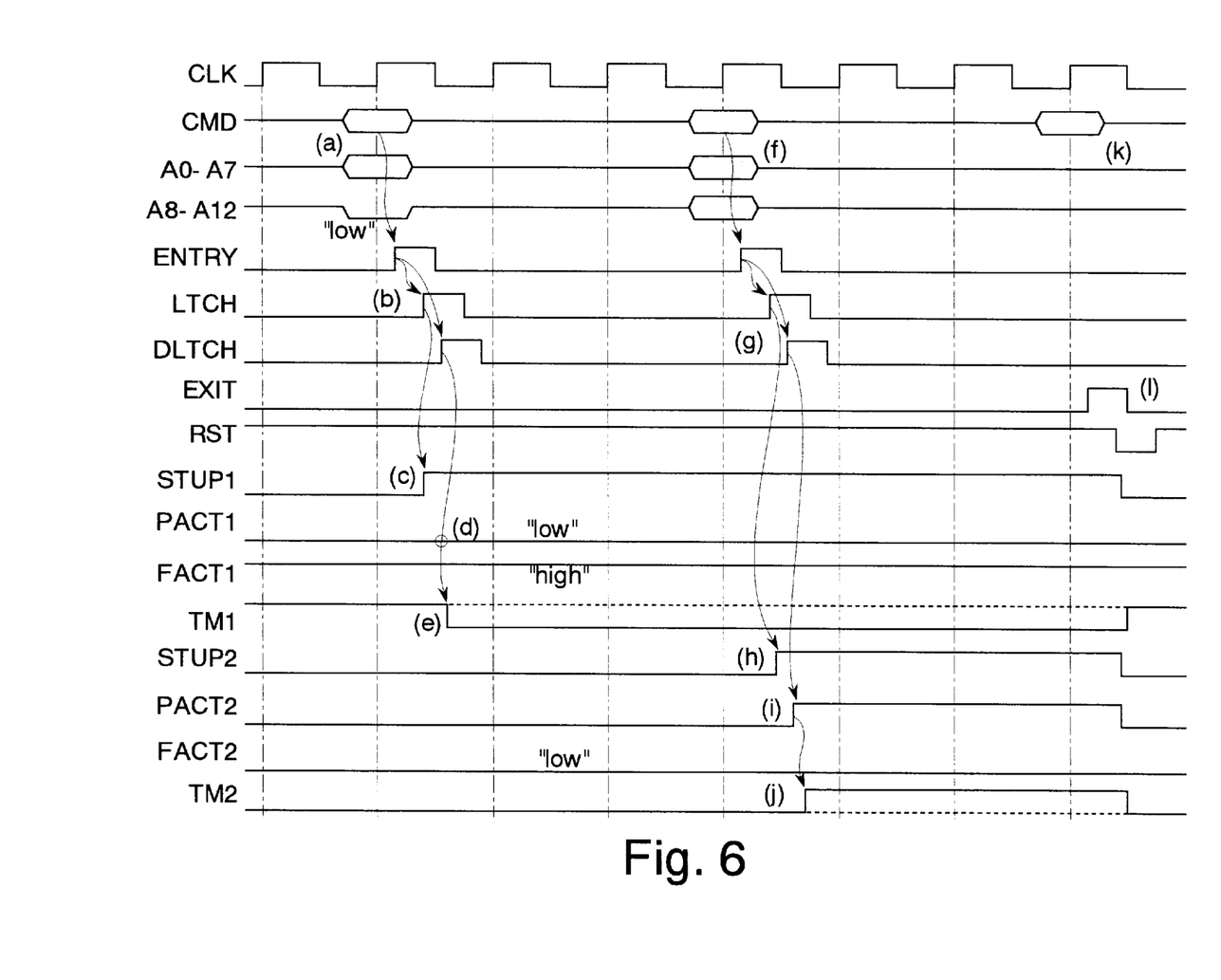
FIG. 6 is a timing diagram showing control of re-trimming in the second embodiment.

FIG. 6 shows timing for re-trimming. As in the first embodiment, a description is given of an example of controlling an adjustment circuit 20 whose fuse has blown("1" is added to the symbol name), and an adjustment circuit 20 whose fuse has not blown ("2" is added to the symbol name).

First, in synchronization with the rise of a clock signal CLK, a command signal (CMD) for trimming, address signals A0 through A7 that designate the adjustment circuit 20 whose fuse has blown, and low-leveled address signals A8 through A12 to invalidate the trimming are supplied (FIG. 6(a)).

As in the first embodiment, the entry signal ENTRY is activated, wherein the latch signal LTCH and delayed latch signal DLTCH are activated (FIG. 6(b)).

The characteristic decoder 22 receives a latch signal LTCH and activates the setup signal STUP1 (is made into a high level) (FIG. 6(c)). The respective parameter decoders 26 of the parameter controlling circuit 24 are activated upon receiving a setup signal STUP1 and outputs a low-leveled parameter activating signal PACT in synchronization with the delayed latch signal DLTCH (FIG. 6(d)). That is, the respective parameter decoders 26 receive low-leveled address signals A8 through A12 and outputs a low-leveled parameter activating signal PACT to invalidate the trimming. The invalidation of the trimming by the address signals A8 through A12 does not affect the other adjustment circuits 20. That is, the trimming can be individually invalidated in the respective adjustment circuits 20.

The selecting circuit 28 of the adjustment circuit 20 whose fuse has blown outputs a low-leveled parameter activating signal PACT as a test mode signal TM1 upon receiving a high-leveled setup signal STUP (FIG. 6(e)). That is, the fuse activating signal FACT1 that outputs a high level is masked by the blowing of the fuse.

In synchronization with another clock signal CLK, a command signal (CMD) for trimming, address signals A0 through A7 corresponding to the adjustment circuit 20 whose fuse has not blown, and predetermined address signals A8 through A12 that determine adjusting values are supplied (FIG. 6(f)). The entry signal ENTRY, a latch signal LTCH, and a delayed latch signal DLTCH are activated again (FIG. 6(g)).

The characteristic decoder 22 of the adjustment circuit whose fuse has not blown activates the setup signal STUP2 (make the same into a high level) (FIG. 6(h)). A parameter decoder 26 that corresponds to the predetermined address signals A8 through A12 activates a parameter activating signal PACT2 upon receiving a setup signal STUP (makes the same into a high level) (FIG. 6(i)). Although not particularly shown in the drawing, at this time, the parameter decoder 26 that does not correspond the predetermined supplied address signals A8 through A12 inactivates the parameter activating signal PACT. Therefore, one adjustment circuit 20 can set only one adjusting value at all times. As a result, malfunction of the internal circuits to be trimmed can be prevented from occurring.

The selecting circuit 26 outputs a parameter activating signal PCT2 as a test mode signal TM2 (high level) (FIG. 6(j)). That is, the state becomes equivalent to a state where the fuse blows.

Thus, by a command input and an address input, predetermined adjustment circuits 20 are trimmed circuit by circuit regardless of whether or not the fuse blows, and the electrical characteristics of the DRAM can be evaluated by using an LSI tester.

After the characteristics are evaluated, as in the first embodiment, a command signal (CMD) is supplied to terminate a trimming test (FIG. 6(j)). And, the exit signal EXIT and reset signal RST are activated, wherein the test mode is terminated (FIG. 6(k)). The DRAM enters a state where the fuse blows and it will be shipped.

The embodiment can bring about effects that are similar to those of the first embodiment described above. Further, in the embodiment, the characteristic decoder 22 and parameter decoder 26 were constituted in a hierarchical structure. Therefore, circuit design and layout design can be facilitated. Since the number of the characteristic decoders 22 can be decreased, the chip size thereof can be reduced.

Since address signals A0 through A7 that show the internal circuits for adjusting the characteristics and address signals A8 through A12 that show the adjusting values of the characteristics are supplied along with supply of a command signal for a trimming test, the fuse activating signal FACT can be invalidated, and at the same time, a new adjusting value can be established. Therefore, it is possible to shorten the time required for a trimming test.

The characteristic decoder 22 and parameter decoder 26 are constructed in a hierarchical structure, and address signals A8 through A12 are supplied to only the parameter decoder 26 in which the setup signal STUP is activated. Accordingly, it is possible to invalidate the fuse activating signal FACT in the adjustment circuits 20 one by one.

Since only one adjusting value can be established in one adjustment circuit 20, it is possible to prevent malfunction of the internal circuits to be trimmed from occurring.

The characteristic decoder 22 outputs a setup signal STUP by decoding the address signals A0 through A7. Therefore, it is possible to easily design a plurality of characteristic decoders 22 by only changing address signals A0 through A7. As a result, the design can be easily verified. Also, it is possible to form 256 types of characteristic decoders 22 by using 8-bit address signals A0 through A7.

The characteristic decoder 22 and parameter decoder 26 are selected by using address signals A0 through A12. Therefore, the address signals A0 through A12 that are scarcely utilized in the test mode can be effectively used.

Also, in the first embodiment described above, a description was given of the example in which the switching signal SW is activated by the address signal A12. The present invention is not limited to such an embodiment. For example, the switching signal SW may be activated by using a data input/output terminal or an exclusive signal.

In the above-described embodiments, a description was given of the example in which the invention is applied to control the adjustment of the characteristics of the internal circuits. The invention is not limited to such embodiments. For example, it may be applicable to an example of controlling a relieving circuit to relieve the malfunction of memory cells and such. By applying the present invention, information relieved once can be invalidated.

In the above-described embodiments, a description was given of the example in which the invention is applied to a semiconductor integrated circuit where a fuse is used to adjust the characteristics of the internal circuits. The invention is not limited to such embodiments. For example, the invention may be applicable to a semiconductor integrated circuit in which an unvolatile memory cell is used to adjust the characteristics of the internal circuits.

In the above-described embodiment, a description was given of the example in which the invention is applied to a DRAM. However, the invention is not limited to such embodiments. For example, the invention may be applicable to other memory LSIs, or may be applicable to system LSIs, microcomputers, and logic LSIs in which a memory core of DRAMs are implemented.

In addition, the process for manufacturing semiconductors, to which the invention is applied, is not limited to a CMOS process, but may be a Bi-CMOS process.

The invention is not limited to the above embodiments and various modifications may be made without departing from the spirit and scope of the invention. Any improvement may be made in part or all of the components.

What is claimed is:

1. A semiconductor integrated circuit comprising:
   an adjustment control circuit that activates a first adjustment signal for adjusting a characteristic of an internal circuit in response to adjustment signals received from an external source;
   a ROM circuit that activates a second adjustment signal for adjusting the characteristic of said internal circuit when information to adjust the characteristic of said internal circuit is programmed;
   a switch control circuit that outputs a switching signal in response to control signals received from the external source; and
   a selecting circuit that outputs any one of said first adjustment signal and said second adjustment signal to said internal circuit in response to said switching signal.

2. The semiconductor integrated circuit according to claim 1, further having a normal operation mode and a test mode, wherein
   said adjustment control circuit is activated during said test mode and activates said first adjustment signal in response to said adjustment signal.

3. The semiconductor integrated circuit according to claim 2, further comprising a command decoder that outputs a command control signal to control operation of said internal circuit in response to receiving a command signal from the external source, wherein
   said adjustment control circuit is controlled by said command control signal corresponding to a test mode in which the characteristic of said internal circuits is adjusted.

4. The semiconductor integrated circuit according to claim 2, wherein said adjustment control circuit receives a plurality of said adjustment signals and activates said first adjustment signal when said adjustment signals are of predetermined logic.

5. The semiconductor integrated circuit according to claim 4, further comprising a plurality of memory cells, wherein
   a plurality of said adjustment signals are address signals for selecting said memory cells.

6. A method for adjusting a characteristic of a semiconductor integrated circuit, comprising the steps of:
   masking, in accordance with a switching signal that is generated in response to a control signals received from an external source, a second adjustment signal that a ROM circuit outputs, said ROM circuit programmed information to change a characteristic of an internal circuit; and
   adjusting the characteristic of said internal circuit by a first adjustment signal generated in response to adjustment signals received from the external source.

7. The method for adjusting the characteristic of a semiconductor integrated circuit according to claim 6, further comprising the steps of:
   activating said switching signal corresponding to one characteristic of said internal circuit in response to a selecting signal from the external source; and
   receiving a plurality of said adjustment signals from the external source, determining an adjustment value of the characteristic of said internal circuit in response to the logic of said adjustment signals, and adjusting the characteristic of said internal circuit by one of said first adjustment signal corresponding to said adjusting value.

8. A semiconductor integrated circuit comprising:
   a characteristic control circuit which corresponds to a characteristic of an internal circuit and generates a control signal in accordance with a combination of selecting signals received from an external source; and
   a plurality of parameter controlling circuits corresponding to adjusting values of said characteristic of said internal circuit, respectively, wherein
   each of said parameter controlling circuits includes:
   an adjustment control circuit that is activated in accordance with a combination of adjustments signals received from the external source and then activates a first adjustment signal for adjusting a characteristic of said internal circuit;
   a ROM circuit that activates a second adjustment signal for adjusting the characteristic of said internal circuit when information to adjust the characteristic of said internal circuit is programmed; and
   a selecting circuit that outputs one of said first adjustment signal and said second adjustment signal to said internal circuit in response to said control signal.

9. The semiconductor integrated circuit according to claim 8, further comprising a command decoder that outputs a command control signal to control operation of said internal circuit in response to receiving a command signal from the external source, wherein
said characteristic control circuit is controlled by said command signal corresponding to a test mode for adjusting the characteristic of said internal circuits.

10. A semiconductor integrated circuit comprising a plurality of adjustment control circuits each including:
a characteristic control circuit which corresponds to a characteristic of an internal circuit and generates a control signal in accordance with a combination of selecting signals received from an external source; and
a plurality of parameter controlling circuits corresponding to adjusting values of said characteristic of said internal circuit, respectively, wherein
each of said parameter controlling circuits includes:
an adjustment control circuit that is activated in accordance with a combination of adjustments signals received from the external source and then activates a first adjustment signal for adjusting a characteristic of said internal circuit;
a ROM circuit that activates a second adjustment signal for adjusting the characteristic of said internal circuit when information to adjust the characteristic of said internal circuit is programmed; and
a selecting circuit that outputs any one of said first adjustment signal and said second adjustment signal to said internal circuit in response to said control signal.

* * * * *